United States Patent
Okada et al.

(10) Patent No.: US 8,154,129 B2
(45) Date of Patent: Apr. 10, 2012

(54) ELECTRODE STRUCTURE AND SEMICONDUCTOR DEVICE

(75) Inventors: Kikuo Okada, Gunma (JP); Kojiro Kameyama, Gunma (JP); Takahiro Oikawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 311 days.

(21) Appl. No.: 12/307,228

(22) PCT Filed: Apr. 4, 2008

(86) PCT No.: PCT/JP2008/057127
§ 371 (c)(1), (2), (4) Date: Mar. 25, 2009

(87) PCT Pub. No.: WO2008/126914
PCT Pub. Date: Oct. 23, 2008

(65) Prior Publication Data
US 2009/0315175 A1    Dec. 24, 2009

(30) Foreign Application Priority Data
Apr. 6, 2007 (JP) ................................. 2007-100838

(51) Int. Cl.
*H01L 23/492* (2006.01)
(52) U.S. Cl. ........ 257/762; 257/331; 257/334; 257/737; 257/E23.072
(58) Field of Classification Search .................. 257/737, 257/762, E23.072, 328–334; 174/126.2
See application file for complete search history.

(56) References Cited

U.S. PATENT DOCUMENTS

| | | | | |
|---|---|---|---|---|
| 3,461,357 A * | 8/1969 | Mutter et al. | ................. | 257/762 |
| 5,011,580 A * | 4/1991 | Pan et al. | ....................... | 205/118 |
| 6,759,599 B2 * | 7/2004 | Tatoh et al. | ................... | 174/261 |
| 6,930,354 B2 * | 8/2005 | Shirai et al. | ................... | 257/330 |
| 7,235,844 B2 * | 6/2007 | Itou | ............... | 257/341 |
| 2003/0230804 A1* | 12/2003 | Kouno et al. | ................. | 257/734 |
| 2004/0183202 A1* | 9/2004 | Usami | .......................... | 257/762 |
| 2005/0258484 A1* | 11/2005 | Itou | ............... | 257/341 |
| 2006/0071271 A1 | 4/2006 | Omura et al. | | |
| 2006/0263988 A1 | 11/2006 | Takahashi et al. | | |

FOREIGN PATENT DOCUMENTS

JP    2001-250946    9/2001
(Continued)

OTHER PUBLICATIONS

International Search Report mailed on Jul. 8, 2008 directed at counterpart application No. PCT/JP2008/057127; 7 pages.

*Primary Examiner* — Allan R Wilson
(74) *Attorney, Agent, or Firm* — Morrison & Foerster LLP

(57) ABSTRACT

In a power MOS transistor, for example, a source electrode is formed so as to be commonly connected to a plurality of source regions formed on the front surface. Thus, a current density varies based on in-plane resistance of the source electrode, thereby providing the necessity of increasing the number of wires connecting the sources and a lead. In the invention, an electrode structure includes a copper plating layer 10*e* formed on a pad electrode 10*a* by an electrolytic plating method, and a nickel plating layer 10*f* and a gold plating layer formed so as to cover the upper and side surfaces of the copper plating layer 10*e* by an electroless plating method.

6 Claims, 12 Drawing Sheets

FOREIGN PATENT DOCUMENTS

| | | |
|---|---|---|
| JP | 2002-329808 | 11/2002 |
| JP | 2003-142651 | 5/2003 |
| JP | 2004-71886 | 3/2004 |
| JP | 2005-101293 | 4/2005 |
| JP | 2005-166757 | 6/2005 |
| JP | 2006-121041 | 5/2006 |
| JP | 2006-324320 | 11/2006 |
| JP | 2007-73611 | 3/2007 |

* cited by examiner

ELECTRODE STRUCTURE AND SEMICONDUCTOR DEVICE

REFERENCE TO RELATED APPLICATIONS

This application is a national stage application under 35 USC 371 of International Application No. PCT/JP08/057127, filed Apr. 4, 2008, which claims the priority of Japanese Patent Application No. 2007-100838, filed Apr. 6, 2007, the contents of which prior applications are incorporated herein by reference.

BACKGROUND OF THE INVENTION

1. Field of the Invention

The invention relates to an electrode structure and a semiconductor device, and reduction of on-resistance.

2. Description of the Related Art

In recent years, due to a mobile terminal or the like used widely, a switching element is required to be small and have low on-resistance. Therefore, in a power MOS transistor, for example, operation cells of MOS transistors are integrated in a single semiconductor die so as to be connected parallel, and a high current flows in the vertical direction of the semiconductor die.

For example, in a vertical MOS transistor having a trench structure in which a channel is formed on a side surface of a trench, high density formation of 72 million operation cells per square inch reduces the on-resistance to 12 mΩ.

FIG. 11 shows a conventional semiconductor device, and (a) shows a plan view and (b) shows a cross-sectional view of line x-x.

A semiconductor die 101 has a plurality of operation cells (not shown) on its front surface side, forming a vertical MOS transistor in which a current flows between the front surface and the back surface. In detail, a source electrode 110 and a gate pad electrode 112 are formed on the front surface of the semiconductor die 101. An operation cell has a gate electrode, a gate oxide film and a source region. The source electrode 110 covers all the operation cells and is connected to each of the source regions. Each of the gate electrodes is electrically connected to the gate pad electrode 112. In this structure, the source electrode 110 and the gate pad electrode 112 are electrically connected to leads 116a, 116b through wires 117a, 117b, respectively. A collector electrode 113 is formed on the back surface of the semiconductor substrate 1. The collector electrode 113 is bonded to an island 114 with conductive paste 115 such as solder or the like.

The relevant technique is described in Japanese Patent Application Publication No. 2001-250946.

As described above, the source electrode 110 is formed so as to cover all the plurality of operation cells. However, the wire 117a is bonded to only a part of the source electrode 110, thereby causing differences in distances between a bonding portion 119 of the wire 117a and the operation cells. As a result, the operation cells operate unevenly based on the resistance of the source electrode 110, and the die may be broken due to current concentration.

Therefore, conventionally, many approaches have been taken for minimizing the uneven operation of the operation cells.

For example, as shown in FIG. 12, the source electrode 110 and the lead 116a are connected through a plurality of wires 117a. The wires 117a are bonded to the source electrode 110 in a wide region. This reduces differences in distances between the bonding portions 119 of the wires 117a and the operation cells, thereby providing an even current density.

However, a semiconductor device is being miniaturized year after year, and increase of the number of the wires 117a prohibits the miniaturization. Furthermore, the wires 117a need be carefully bonded to the source electrode 110 so as not to short-circuit an interlayer insulation film insulating the gate electrode and the source electrode 110 due to stress caused by the bonding, and the increase of the number of the wires 117a increases the possibility of occurrence of a defect. Furthermore, the cost increases corresponding to the increase of the number of the wires 117a.

Furthermore, as shown in FIGS. 13A and 13B, the source electrode 110 and a lead 120a are connected through a metal frame 120b formed together with the lead 120a without using a wire. Since the metal frame 120b is bonded to the source electrode 110 in a wide region, each of the operation cells is hardly influenced by the in-plane resistance of the source electrode 110. Furthermore, the metal frame 120b has largely lower resistance than a wire, thereby realizing a semiconductor device having low on-resistance.

However, when the area of the metal frame 120b is increased corresponding to the area of the source electrode 110, conductive paste 122 bonding the source electrode 110 and the metal frame 120b easily becomes uneven and the current density varies accordingly. Furthermore, it is difficult to align the source electrode 110 and the metal frame 120b when these are bonded. Furthermore, the cost increases corresponding to the area of the metal frame 120b.

SUMMARY OF THE INVENTION

Considering the above, an electrode structure according to the invention includes: a pad electrode; a protection film formed covering the pad electrode so as to partially expose the pad electrode; a copper plating layer formed on the pad electrode; and a cap layer formed on the copper plating layer, wherein the copper plating layer and the cap layer are continuously formed by an electrolytic plating method, and the copper plating layer is covered by a passivation film on its side surface.

An electrode structure according to the invention includes: a pad electrode; a protection film formed covering the pad electrode so as to partially expose the pad electrode; a copper plating layer formed on the pad electrode; and a cap layer formed on the copper plating layer, wherein the copper plating layer is formed by an electrolytic plating method and the cap layer is formed by an electroless plating method so as to cover upper and side surfaces of the copper plating layer.

A semiconductor device according to the invention includes: a plurality of operation cells and a first electrode connected to all the operation cells on a front surface of a semiconductor substrate, wherein a current flows in a vertical direction of the semiconductor substrate by operation of the operation cells, the first electrode being electrically connected to a first external connection terminal through a bonding portion, and the first electrode including a copper plating layer for minimizing uneven operation based on distances between the operation cells and the bonding portion.

In the invention, a semiconductor device has an electrode structure having a thick copper plating layer formed by an electrolytic plating method. Therefore, the position and number of a bonding portion of an electrode are freely designable.

Furthermore, since the copper plating layer is covered by a passivation film or a plating film on its side surface portion, oxidation of the side surface portion is prevented regardless of the thickness of the copper plating layer.

DETAILED DESCRIPTION OF THE INVENTION

Figure 1A:
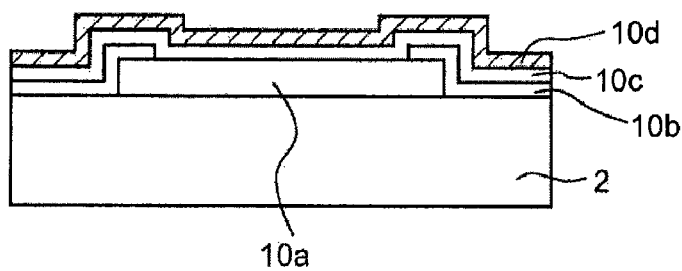
FIG. 1 shows a first electrode structure and a process of manufacturing the same.
Figure 1B:
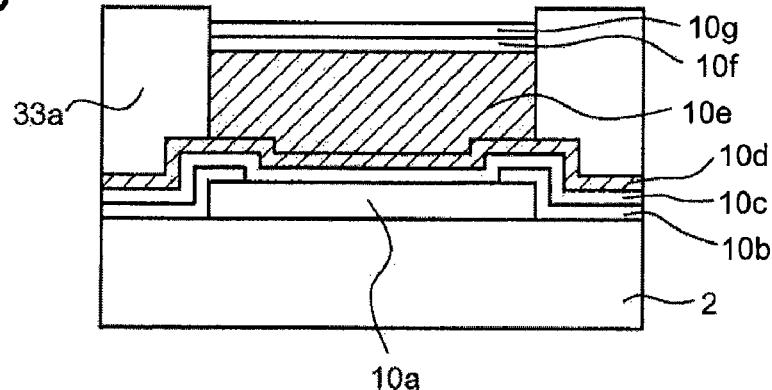
Figure 1C:
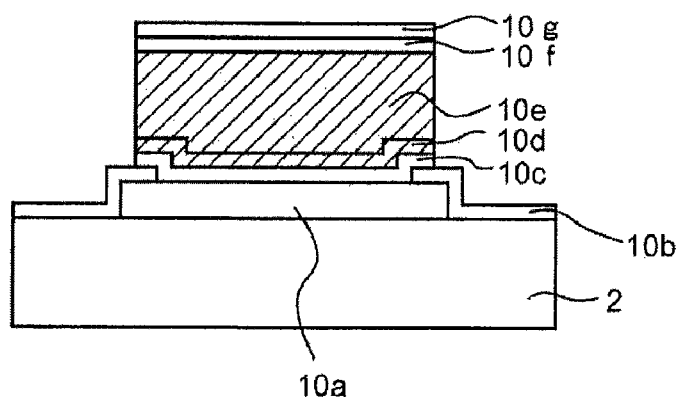
Figure 1D:
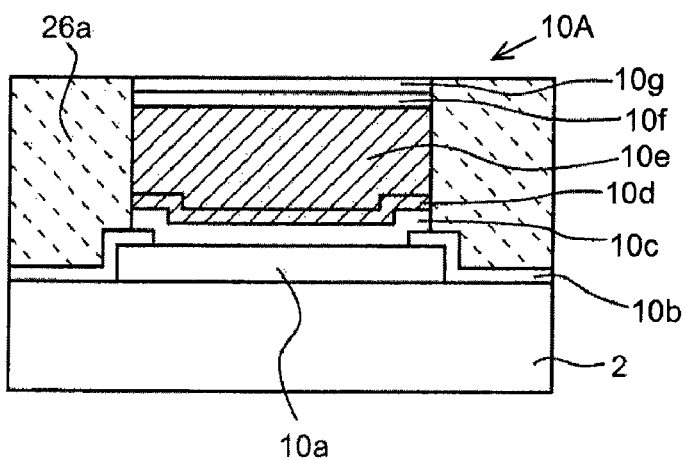
Figure 2A:
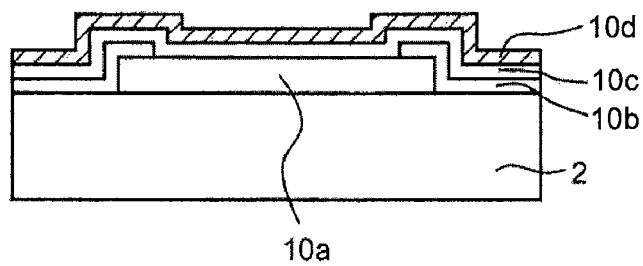
FIG. 2 shows a second electrode structure and a process of manufacturing the same.
Figure 2B:
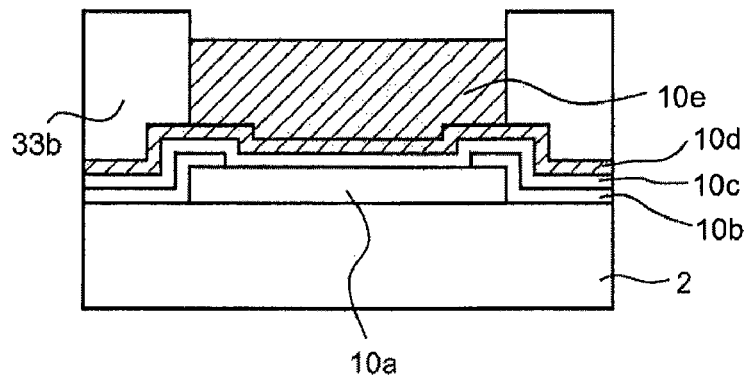
Figure 2C:
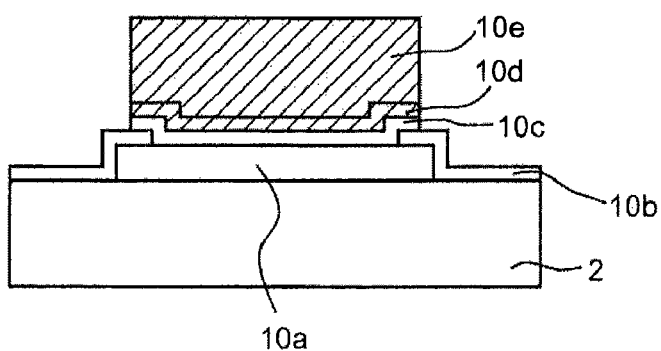
Figure 2D:
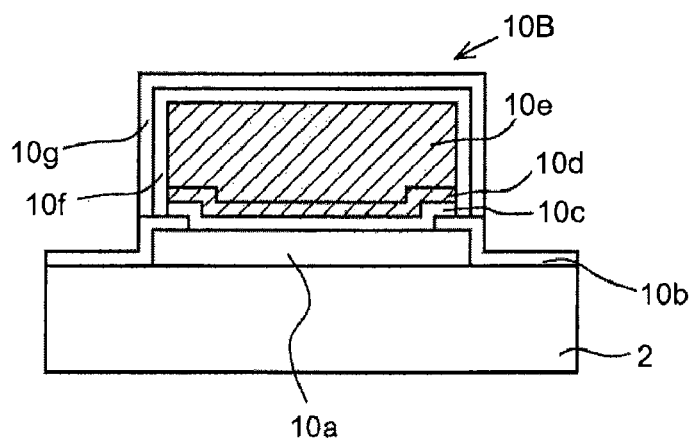

A semiconductor device of an embodiment of the invention will be described in detail referring to figures. In the following, an electrode structure is described first, then a semiconductor die having the electrode structure is described, and lastly a semiconductor device having the semiconductor die is described.

<Electrode Structure>

First, an electrode structure of a semiconductor device will be described in detail. In the following, a numeral 2 indicates a semiconductor substrate, where an element region such as a source region or the like is formed on the front surface in a case of a MOS transistor, for example, although the detail is omitted here. A numeral 10a indicates a pad layer, which is formed by depositing Al by, for example, a sputtering method so as to be electrically connected to the element region.

-First Electrode Structure 10A-

FIG. 1 shows cross-sectional views of a first electrode structure 10A and a method of manufacturing the same.

First, as shown in FIG. 1 (a), a nitride film 10b is formed so as to expose the pad layer 10a. A titanium barrier layer 10c and a copper seed layer 10d are then continuously formed on the nitride film 10b by a sputtering method or a vapor deposition method so as to be electrically connected to the pad layer 10a.

As shown in FIG. 1 (b), a resist film 33a is patterned so as to have an opening on the pad layer 10a. A copper plating layer 10e, a nickel plating layer 10f and a gold plating layer 10g are then continuously deposited by an electrolytic plating method.

Then, as shown in FIG. 1 (c), the resist film 33a is removed, and the exposed portions of the titanium barrier layer 10c and the copper seed layer 10d are partially removed.

Then, as shown in FIG. 1 (d), a passivation film 26a such as a solder resist or the like is patterned so as to cover the side surface of the copper plating layer 10e, thereby completing the first electrode structure 10A.

As described above, in the first electrode structure 10A, the copper plating layer 10e is formed by the electrolytic plating method. Therefore, the formation of the copper plating layer 10e is achieved for a short time at a low cost even when it has a thickness larger than 10 μm.

When the copper plating layer 10e is formed thick, it is easily oxidized at its side surface. However, in the first electrode structure 10A, the passivation film 26a is formed on the side surface of the copper plating layer 10e and prevents the oxidation.

-Second Electrode Structure 10B-

FIG. 2 shows cross-sectional views of a second electrode structure 10B and a method of manufacturing the same.

First, as shown in FIG. 2 (a), in the similar manner to the first electrode structure 10A, the nitride film 10b, the titanium barrier layer 10c and the copper seed layer 10d are formed on the pad layer 10a.

Then, as shown in FIG. 2 (b), a resist film 33b is patterned so as to have an opening on the pad layer 10a. The copper plating layer 10e is then formed by an electrolytic plating method.

Then, as shown in FIG. 2 (c), the resist film 33b is removed and the exposed portions of the titanium barrier layer 10c and the copper seed layer 10d are partially removed.

Then, as shown in FIG. 2 (d), the nickel plating layer 10f and the gold plating layer 10g are formed by an electroless plating method so as to totally cover the copper plating layer 10e.

As described above, in the second electrode structure 10B, the nickel plating layer 10f and the gold plating layer 10g are formed by the electroless plating method so as to cover the copper plating layer 10e including its side surface. This eliminates the necessity of forming the passivation film 26a for preventing the oxidation like in the first electrode structure 10A.

<Structure of Semiconductor Die having First or Second Electrode Structure>

Next, a structure of a semiconductor die having the first or second electrode structure will be described in detail. In the following, a source electrode 10 is formed to have the first or second electrode structure.

It is noted that the following description uses a vertical MOS transistor as an example of a semiconductor die 1. However, the invention is not limited to this, and may be applied similarly to other devices such as IGBT (insulated gate bipolar transistor) or the like as long as a current flows in the vertical direction of the semiconductor die.

-First Semiconductor Die 1A-

Figure 3A:
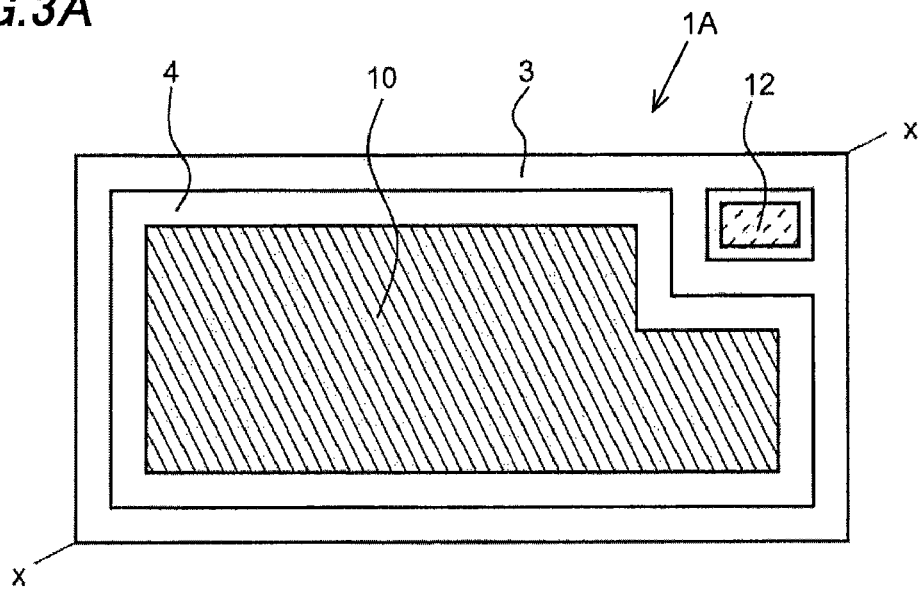
FIG. 3 shows a plan view and a cross-sectional view of a first semiconductor die.
Figure 3B:
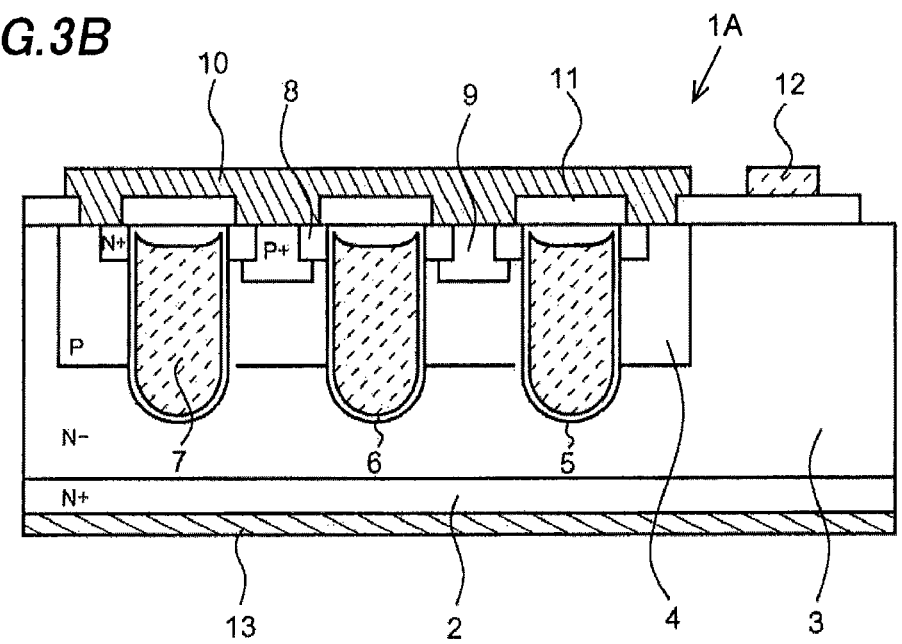

FIG. 3 shows a first semiconductor die 1A, and FIG. 3 (a) is a plan view and FIG. 3 (b) is a cross-sectional view of line x-x.

First, the structure of the semiconductor die 1A will be described. The semiconductor die 1A has, on its front surface side, an N+type semiconductor substrate 2 as a drain region and an N−type epitaxial layer 3, a P type channel layer 4 formed on the front surface of the epitaxial layer 3, trenches 5 formed in the channel layer 4 and extending to the epitaxial layer 3, gate electrodes 7 made of polysilicon embedded in the trenches 5 with gate insulation films 6 therebetween, N+type source regions 8 provided adjacent to the trenches 5, P+type body regions 9 formed between the adjacent source regions 8, a source electrode 10 formed so as to cover the source regions 8, an interlayer insulation film 11 insulating the gate electrodes 7 and the source electrode 10, and a gate pad electrode 12 electrically connected to the gate electrodes 7 through connection wiring (not shown). The semiconductor die 1A further has a drain electrode 13 on its whole back surface.

Next, the operation of the semiconductor die 1A will be described. When a voltage is applied to the gate electrodes 7 through the gate pad electrode 12, channels are formed in the channel layer 4 near the gate electrodes 7. At this time, when a voltage is applied between the source electrode 10 and the drain electrode 13, a current flows from the drain electrode 13 to the semiconductor substrate 2 and the epitaxial layer 3, and then to the source regions 8 through the channels formed in the channel layer 4, reaching the source electrode 10. It means that a plurality of operation cells each having the source region 8, the gate electrode 7 and the gate oxide film 6 is formed in a single die and the operation cells are connected parallel.

At this time, in the first semiconductor die 1A, the source electrode 10 has low in-plane resistance since it has the first or second electrode structure. Therefore, voltages applied to the source regions 8 hardly vary, and thus in-plane current distribution is less biased, thereby preventing current concentration to a certain operation cell.

-Second Semiconductor Die 1B-

Figure 4A:
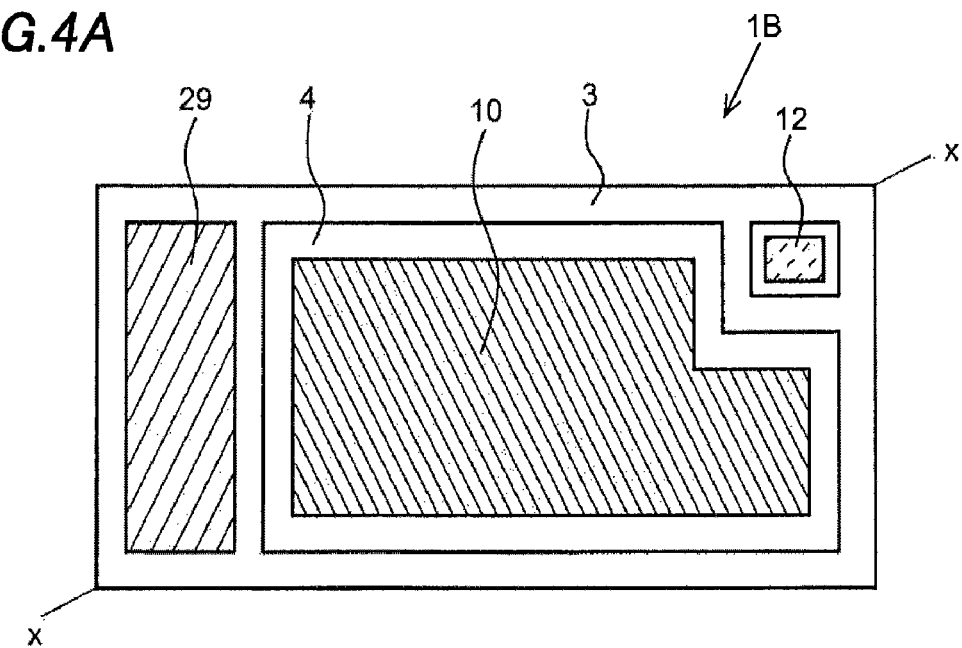
FIG. 4 shows a plan view and a cross-sectional view of a second semiconductor die.
Figure 4B:
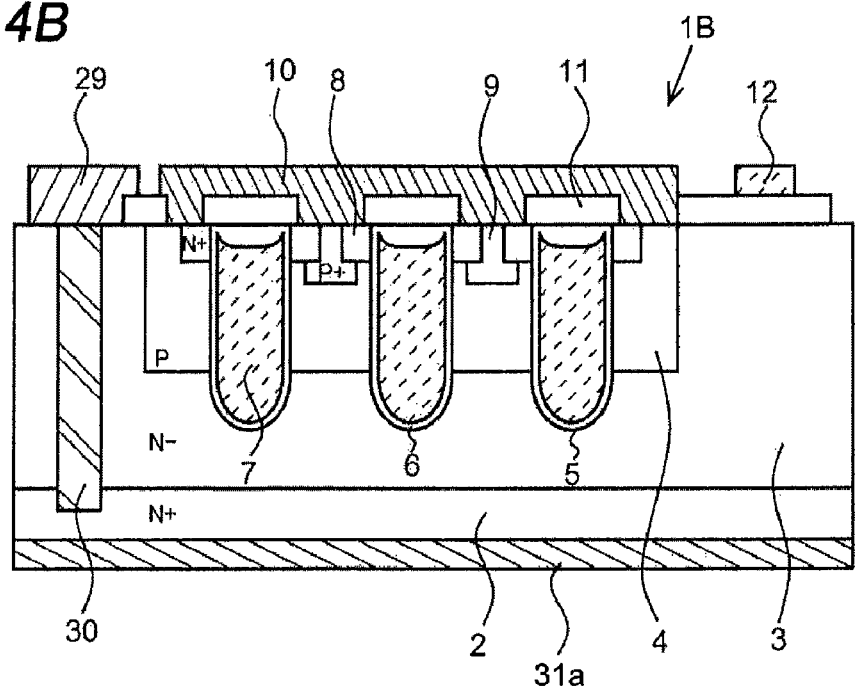

FIG. 4 show a second semiconductor die 1B, and FIG. 4 (a) is a plan view and FIG. 4 (b) is a cross-sectional view of line x-x.

In the second semiconductor die 1B, a drain electrode 29 is formed on the same front surface side as well as the source electrode 10 and the gate pad electrode 12. Furthermore, low-resistance drain current leading means 30 is provided so as to extend from the drain electrode 29 at least to the semiconductor substrate 2.

With this structure, a drain current is led to under the drain electrode 29 through the conductive layer 31a, and further to the drain electrode 29 through the drain current leading means 30.

The drain current leading means 30 need have lower resistance than the epitaxial layer 3, and is preferably an N+type ion implantation layer, an embedded electrode such as metal or the like, for example.

For leading a drain current to the drain electrode 29 formed on the front surface side, other various methods are applicable as descried below.

Figure 5:
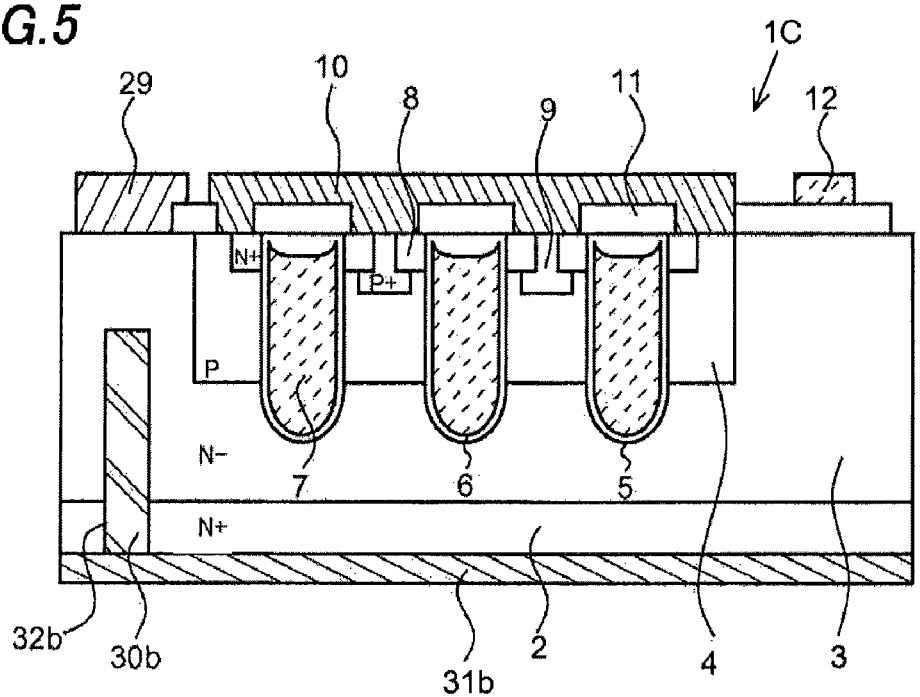
FIG. 5 shows a plane view and a cross-sectional view of a third semiconductor die.

For example, as shown in FIG. 5, drain current leading means 30b may be formed from the back surface of the semiconductor substrate 2 toward the drain electrode 29. In this case, too, a drain current is led to the drain electrode 29 formed on the front surface side. In this embodiment, simultaneous formation of a conductive layer 31b and the drain current leading means 30b is achieved by forming an opening 32b in a position for forming the drain current leading means 30b in advance.

Figure 6:
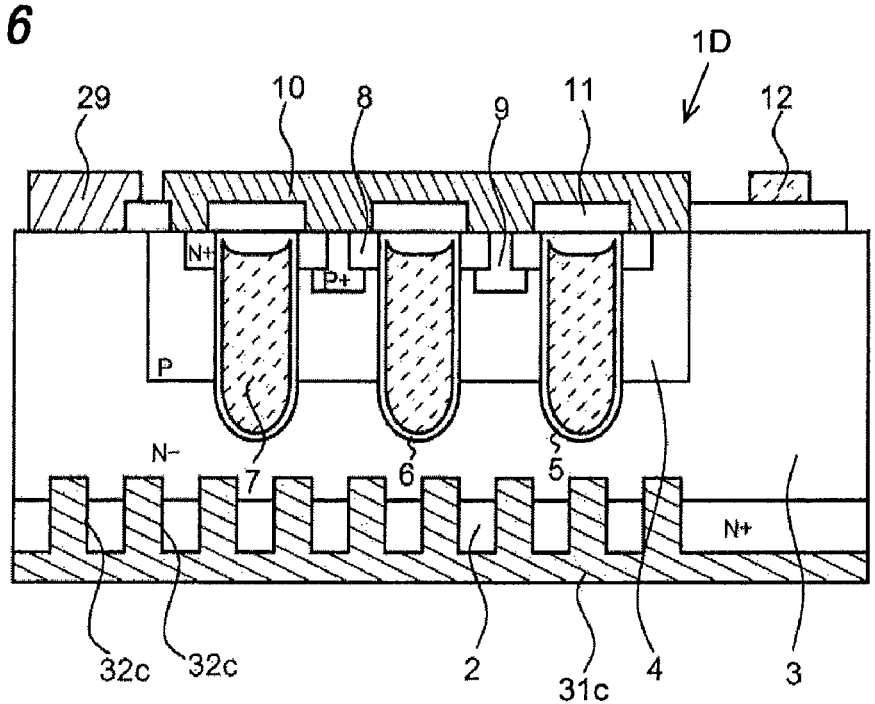
FIG. 6 shows a plane view and a cross-sectional view of a fourth semiconductor die.

Furthermore, as shown in FIG. 6, a plurality of openings 32c may be formed from the back surface of the semiconductor substrate 2 to the epitaxial layer 3 and a conductive layer 31c may be formed so as to be embedded in the openings 32c. With this structure, a drain current flows through a portion of the conductive layer 31c formed in the openings 32c to the drain electrode 29 without through the high resistance semiconductor substrate 2.

<Semiconductor Device having First Semiconductor Die 1A>

Next, a semiconductor device having the first semiconductor die 1A will be described in detail. In the following, a numeral 1A indicates the first semiconductor die 1A, although the detail is omitted. A numeral 10 has the first or second electrode structure, although the detail is omitted.

-First Semiconductor Device 50A-

Figure 7A:
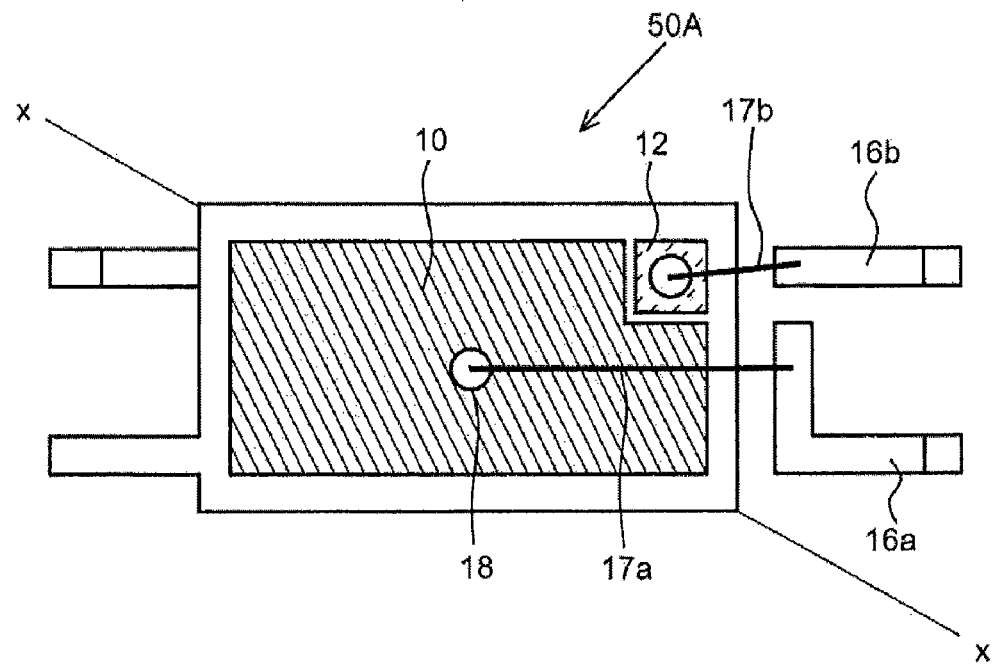
FIG. 7 shows a plan view and a cross-sectional view of a first semiconductor device.
Figure 7B:
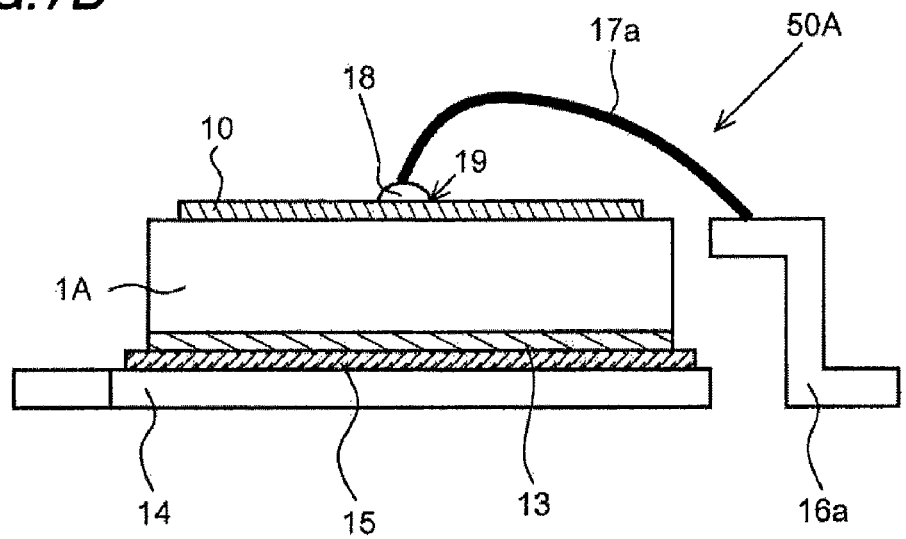

FIG. 7 shows a first semiconductor device 50A, and FIG. 7 (a) is a plan view and FIG. 7 (b) is a cross-sectional view of line x-x.

An island 14 is an external connection terminal electrically connected to the drain electrode 13 of the semiconductor die 1A, which is formed by punching a copper, for example. The semiconductor die 1A is bonded to this island 14 with conductive paste 15 such as solder or silver to electrically connect the island 14 and the drain electrode 13.

A lead 16a is an external connection terminal electrically connected to the source electrode 10 of the semiconductor die 1A through a wire 17a at a bonding portion 19 where conductive paste 18 such as solder or the like is coated, and a lead 16b is an external connection terminal electrically connected to the gate pad electrode 12 of the semiconductor die 1A through a wire 17b.

The source electrode 10 has low in-plane electric resistance since it has the first or second electrode structure. Therefore, the operation cell formed immediately under the bonding portion 19 and the operation cell formed at a distance from the bonding portion 19 operate to flow about the same current.

Since the copper plating layer 10c and the semiconductor die 1A are largely different in coefficient of thermal expansion, when the copper plating layer 10e is formed too thick, it provides the possibility of separation of the source electrode 10 and the semiconductor die 1A. Therefore, by forming the bonding portion 19 at the center of the source electrode 10, preferably, the maximum distance between the bonding portion 19 and the operation cell is reduced, so that the thickness of the copper plating layer 10e is minimized and the separation is prevented.

As described above, in the first semiconductor device 50A, since the number of the wires 17a is reduced, the damage of the interlayer insulation film 11 by wire-bonding is minimized and a short circuit between the gate electrodes 7 and the source electrode 10 is prevented.

-Second Semiconductor Device 50B-

Figure 8A:
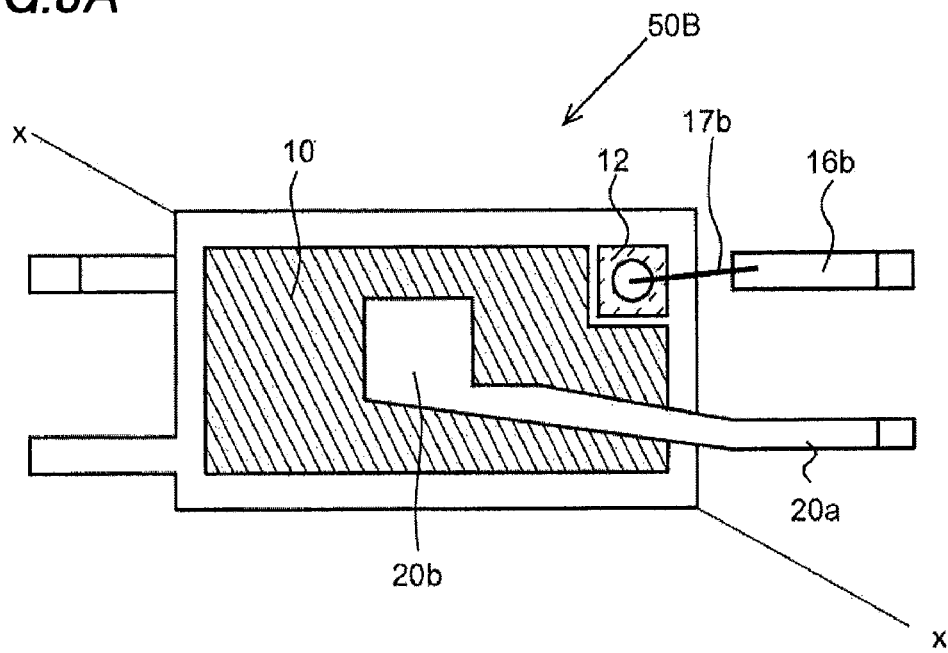
FIG. 8 shows a plan view and a cross-sectional view of a second semiconductor device.
Figure 8B:
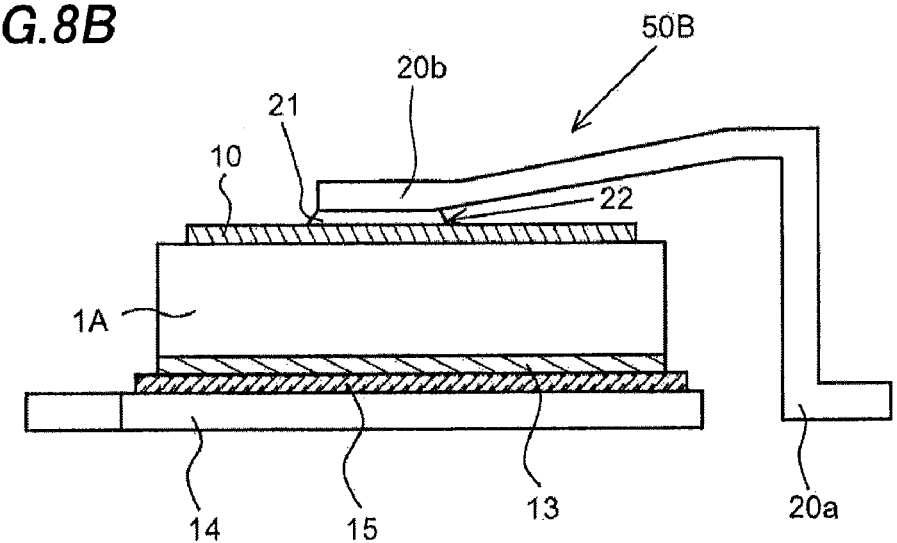

FIG. 8 shows a second semiconductor device 50B, and FIG. 8 (a) is a plan view and FIG. 8 (b) is a cross-sectional view of line x-x.

In the second semiconductor device 50B, a lead 20a is formed together with a metal frame 20b, and this metal frame 20b is electrically connected to the source electrode 10 at a bonding portion 22 where conductive paste 21 such as solder or the like is coated.

The source electrode 10 has low in-plane electric resistance since it has the first or second electrode structure. Therefore, the metal frame 20b is formed to have a small area such that the conductive paste 21 spreads evenly between the source electrode 10 and the metal frame 20b, thereby minimizing variation of on-resistance. Furthermore, preferably, the metal frame 20b is formed at the center of the source electrode 10 at a distance from the end of the source electrode 10. This reduces the maximum distance between the bonding portion 22 and the operation cell, and further prevents the conductive paste 21 from spreading to the gate pad electrode 12 and causing a short circuit.

-Third Semiconductor Device 50C-

Figure 9A:
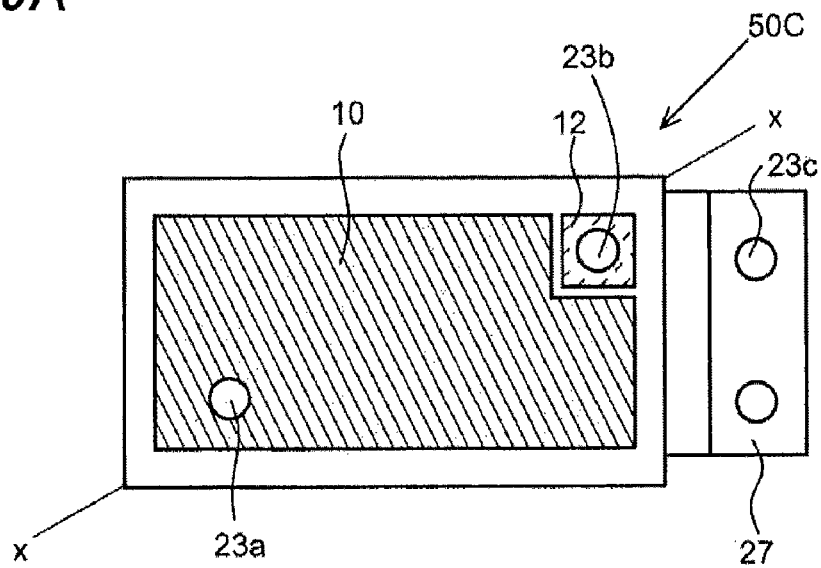
FIG. 9 shows a plan view and a cross-sectional view of a third semiconductor device.
Figure 9B:
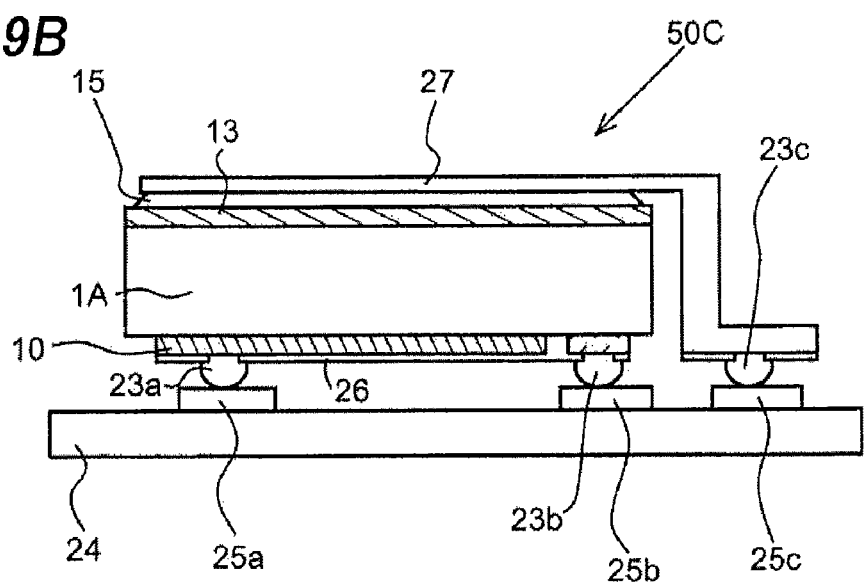

FIG. 9 shows a third semiconductor device 50C, and FIG. 9 (a) is a plan view and FIG. 9 (b) is a cross-sectional view of line x-x.

In the third semiconductor device 50C, the external terminals of the source electrode 10, the gate pad electrode 12 and the drain electrode 13 are formed of a source bump electrode 23a, a gate bump electrode 23b and a drain bump electrode 23c, respectively. Then, the semiconductor die 1A is mounted facedown on conductive patterns 25 of a mounting substrate 24, and the bump electrodes 23 and the conductive patterns 25 are respectively aligned and bonded by solder reflowing with heat or supersonic vibration under pressure.

In detail, the source bump electrode 23a and the gate bump electrode 23b are formed on the source electrode 10 and the gate pad electrode 12 and electrically connected thereto respectively so as to be exposed from the contact holes of the protection film 26 made of, for example, solder resist. Furthermore, the drain electrode 13 is electrically led to the front surface side of the semiconductor die 1A by a leading frame 27 extending from the back surface of the semiconductor die 1A to the front surface thereof, and electrically connected to the conductive pattern 25c through the drain bump electrode 23c.

The source electrode 10 has low in-plane electric resistance since it has the first or second electrode structure. Therefore, the position and number of the source bump electrode 23a are freely designable corresponding to the conductive pattern 25a of the mounting substrate 24.

<Semiconductor Device having Second Semiconductor Die 1B>

Next, a semiconductor device having the second semiconductor die 1B will be described in detail. In the following, a numeral 1B indicates the second semiconductor die 1B, although the detail is omitted. A numeral 10 has the first or second electrode structure, although the detail is omitted.

-Fourth Semiconductor Device 50D-

Figure 10A:
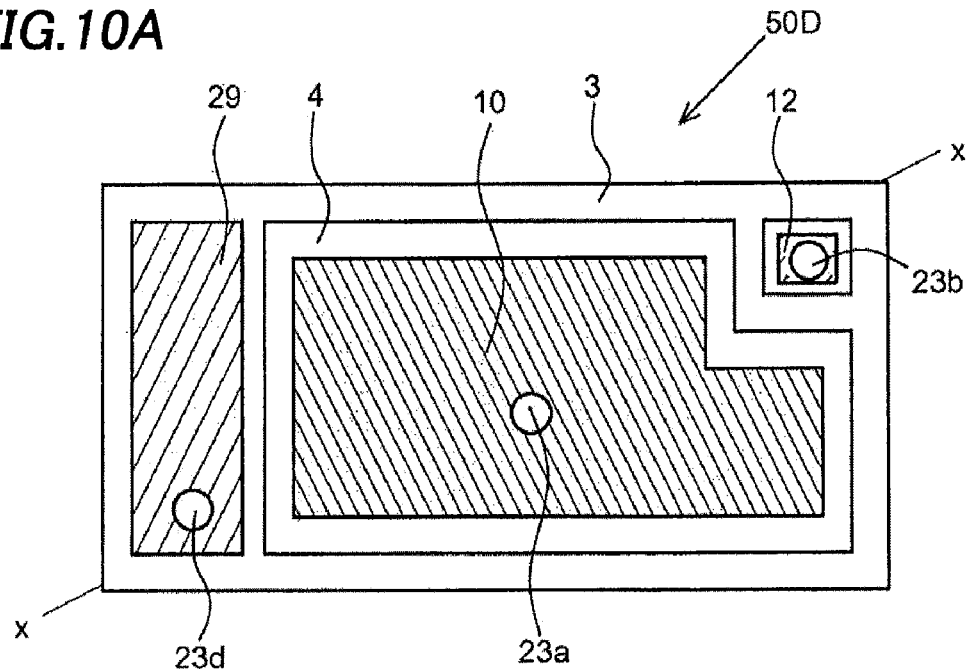
FIG. 10 shows a plan view and a cross-sectional view of a fourth semiconductor device.
Figure 10B:
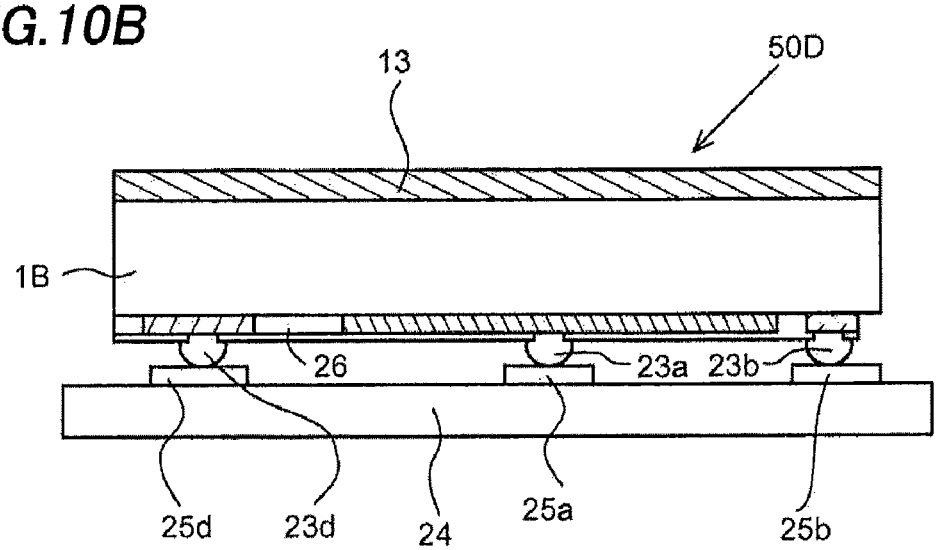
Figure 11A:
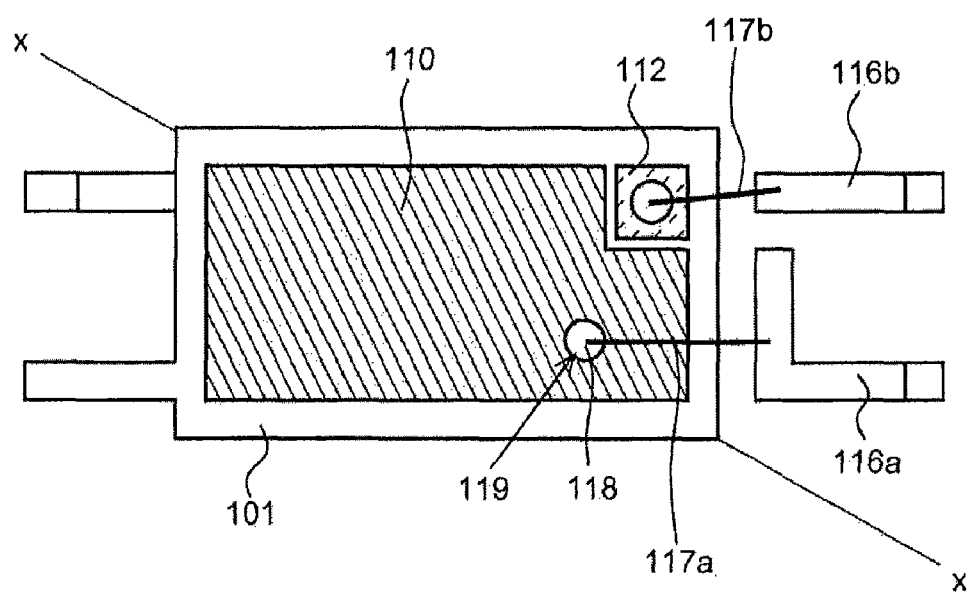
FIG. 11 shows a plan view and a cross-sectional view of a conventional semiconductor device.
Figure 11B:
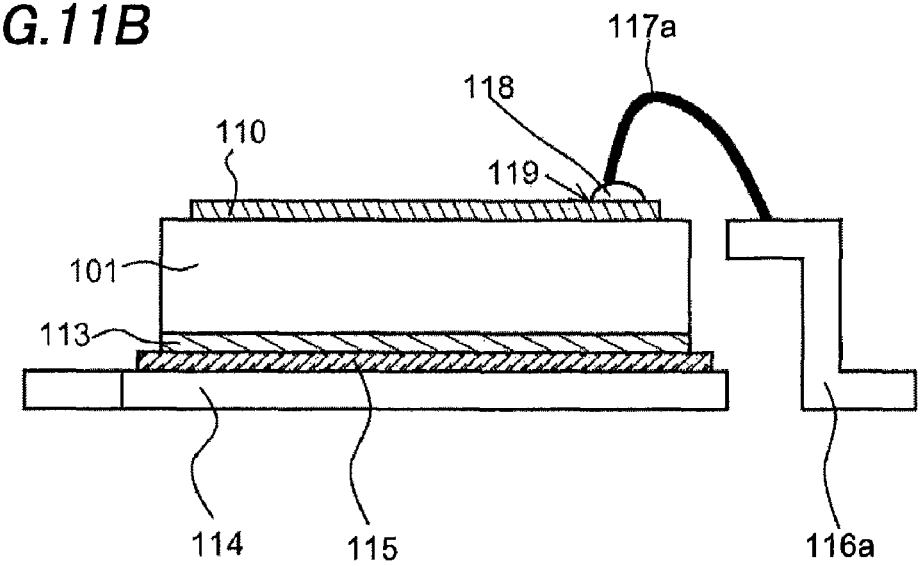
Figure 12A:
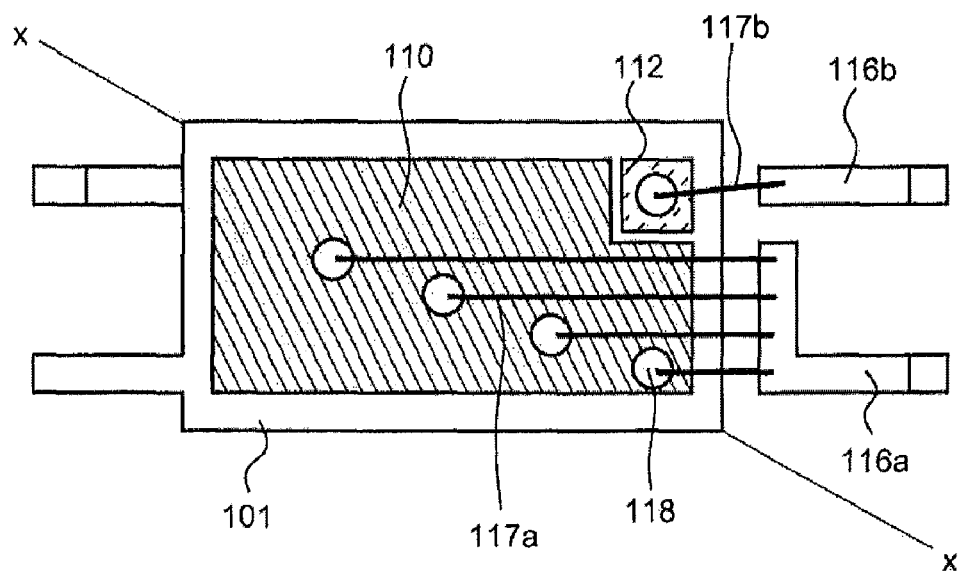
FIG. 12 shows a plan view and a cross-sectional view of a conventional semiconductor device.
Figure 12B:
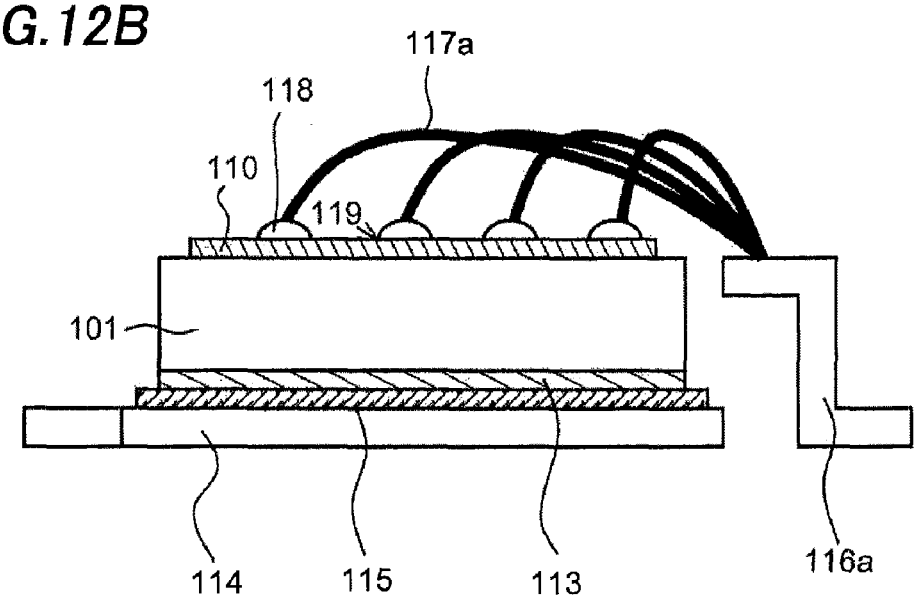
Figure 13A:
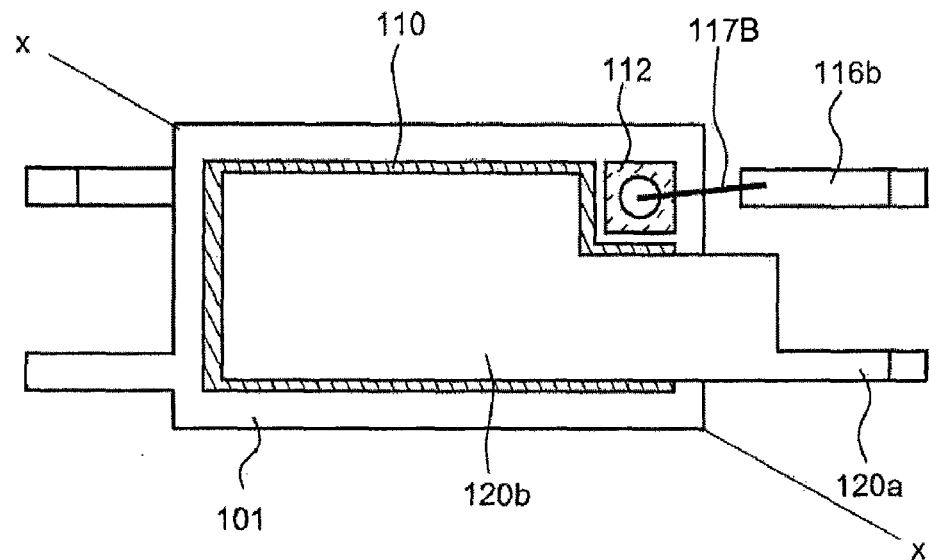
FIG. 13 shows a plan view and a cross-sectional view of a conventional semiconductor device.
Figure 13B:
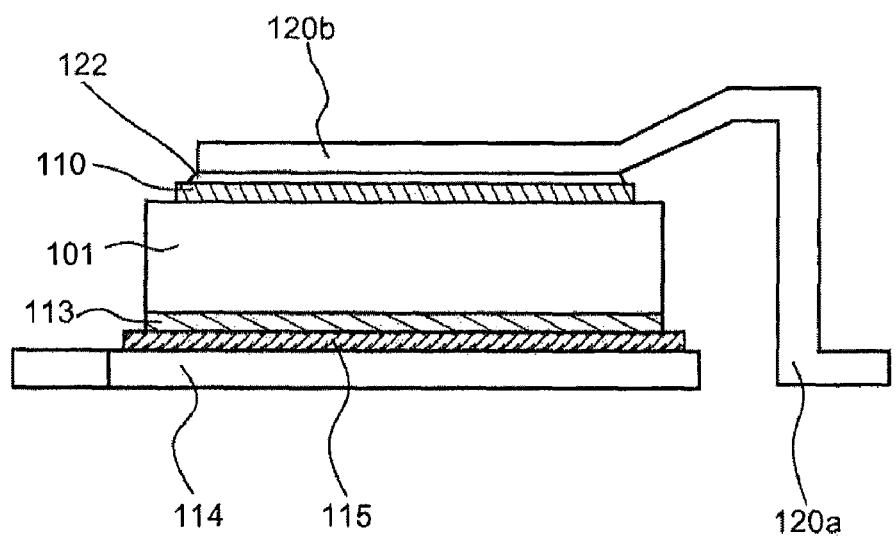

FIG. 10 show a fourth semiconductor device 50D, and FIG. 10 (a) is a plan view and FIG. 10 (b) is a cross-sectional view of line x-x.

The semiconductor die 1B has the source bump electrode 23a on the source electrode 10, the gate bump electrode 23b on the gate pad electrode 12, and the drain bump electrode 23d on the drain electrode 29, which are mounted facedown on the conductive patterns 25a, 25b and 25d of the mounting substrate 24, respectively.

The source electrode 10 has low in-plane electric resistance since it has the first or second electrode structure. Therefore, the number and position of the source bump electrode 23a are freely designable corresponding to the conductive pattern 25a.

It should be noted that these disclosed embodiments are illustrative in all respects and not limitative. The scope of the invention is defined by claims but not by the above description of the embodiments, and covers all equivalent meanings to claims and all modifications within the scope.

For example, although the gate electrode and the drain electrode are not described in detail in the embodiments described above, these may be formed to have the same structure by the same process as those for the source electrode.

The feature of the invention is that the position and number of the bonding portion of the source electrode 10 and the external connection terminal are freely designable since the source electrode 10 has low in-plane electric resistance, and the position and number of the bonding portion shown in the embodiments are merely an example.

Although a method of forming the drain electrode is not described in detail, it may be formed by the same process as the process of forming the electrodes on the front surface.

The copper plating layer 10e is not necessarily made of pure copper as long as the material is mainly made of copper.

In the second to fourth semiconductor dies 1B to 1D, still lower resistance is realized by forming the openings 32b to 32 penetrating the epitaxial layer 3 and the semiconductor substrate 2 totally to connect the drain electrode 29 and the conductive layers 31b to 31.

What is claimed is:

1. A semiconductor device comprising:
a plurality of operation cells formed in a semiconductor substrate;
a first electrode disposed on a front surface of the semiconductor substrate so as to be connected to the operation cells, the operation cells being configured to allow current flows in a vertical direction of the semiconductor substrate; and
a first external connection terminal electrically connected to the first electrode at a bonding portion,
wherein the first electrode comprises a copper plating layer and a cover layer covering a side surface of the copper plating layer, and the cover layer does not cover a top surface of the copper plating layer and comprises a metal layer for preventing oxidation of the copper plating layer.

2. The semiconductor device of claim 1, wherein the first electrode is connected to a wire connected to the first external connection terminal at the bonding portion with a conductive paste.

3. The semiconductor device of claim 1, wherein the first electrode is connected to a metal frame connected to the first external connection terminal at the bonding portion with a conductive paste, and the metal frame has a smaller surface area than the first electrode.

4. The semiconductor device of claim 1, wherein the first external terminal comprises a first bump electrode, the semiconductor substrate is formed so as to be mounted facedown on a conductive pattern of a mounting substrate, and the first bump electrode is formed corresponding to the conductive pattern.

5. The semiconductor device of claim 4, wherein the semiconductor substrate comprises a second electrode formed on a back surface thereof, and the second electrode is electrically led to the front surface side of the semiconductor substrate by a leading frame extending from the back surface side to the front surface side.

6. The semiconductor device of claim 4, wherein the semiconductor substrate comprises a low resistance region extending in the vertical direction of the semiconductor substrate in a region where the operation cells are not formed, and a current is led from the back surface of the semiconductor substrate through the low resistance region to the front surface of the semiconductor substrate.

* * * * *